(12) United States Patent
Rapinoja

(10) Patent No.: US 9,571,083 B2
(45) Date of Patent: Feb. 14, 2017

(54) ALL-DIGITAL DELAY-LOCKED LOOP TUNING METHOD WITH RANDOMIZED LSB-TUNING

(71) Applicant: Nokia Corporation, Espoo (FI)

(72) Inventor: Tapio Ilmari Rapinoja, Kerava (FI)

(73) Assignee: Nokia Technologies Oy, Espoo (FI)

( * ) Notice: Subject to any disclaimer, the term of this patent is extended or adjusted under 35 U.S.C. 154(b) by 38 days.

(21) Appl. No.: 14/466,798

(22) Filed: Aug. 22, 2014

(65) Prior Publication Data

US 2016/0056806 A1 Feb. 25, 2016

(51) Int. Cl.
*H03K 5/159* (2006.01)
*H03L 7/081* (2006.01)

(52) U.S. Cl.
CPC ............. *H03K 5/159* (2013.01); *H03L 7/0816* (2013.01)

(58) Field of Classification Search
CPC ............. G11C 7/00; G11C 7/222; H03K 5/00; H03K 5/159; H03L 7/00; H03L 7/06; H03L 7/087; H03L 7/0805; H03L 7/0812; H03L 7/0814
USPC ........................................................ 327/158
See application file for complete search history.

(56) References Cited

U.S. PATENT DOCUMENTS

| | | | |
|---|---|---|---|
| 6,329,850 B1 | 12/2001 | Mair et al. | |
| 7,065,172 B2 | 6/2006 | Xiu et al. | |
| 7,702,708 B2 | 4/2010 | Xu et al. | |
| 7,772,893 B2 | 8/2010 | Chen et al. | |
| 7,948,274 B2 | 5/2011 | Rapinoja et al. | |
| 8,063,669 B2 | 11/2011 | Lindfors et al. | |
| 8,120,389 B2 | 2/2012 | Xiu | |
| 2004/0125905 A1* | 7/2004 | Vlasenko | H03L 7/0814 375/376 |
| 2009/0066382 A1* | 3/2009 | Yousefzadeh | H02M 3/1584 327/175 |
| 2009/0103604 A1 | 4/2009 | Xiu et al. | |
| 2009/0160493 A1 | 6/2009 | You et al. | |

OTHER PUBLICATIONS

Calbaza et al., "A direct digital period synthesis circuit," IEEE Journal of Solid-State Circuits, vol. 37, No. 8, pp. 1039-1045, 2002.
Elshazly et al. "Clock Multiplication Techniques Using Digital Multiplying Delay-Locked Loops", IEEE Journal of Solid-State Circuits, vol. 48, No. 6, pp. 1416-1428, 2013.
Helal et al., "A Highly Digital MDLL-Based Clock Multiplier That Leverages a Self-Scrambling Time-to-Digital Converter to Achieve Subpicosecond Jitter Performance". IEEE Journal of Solid-State Circuits, vol. 43, No. 4, pp. 855-863, 2008.

(Continued)

*Primary Examiner* — John Poos
*Assistant Examiner* — David Mattison
(74) *Attorney, Agent, or Firm* — Mintz Levin Cohn Ferris Glovsky and Popeo, P.C.

(57) ABSTRACT

In some example embodiments, there may be provided an apparatus. The apparatus may include a delay line including a plurality of cells; and tuning circuitry coupled to the delay line and configured to generate a first output and a second output to tune the delay of the delay line, wherein the first output tunes in aggregate the plurality of cells of the delay line, and wherein the second output tunes each of the plurality of cells separately. Related methods, systems, and articles of manufacture are also disclosed.

24 Claims, 7 Drawing Sheets

(56) References Cited

OTHER PUBLICATIONS

Kim et al. "A 120-MHz-1.8-GHz CMOS DLL-Based Clock Generator for Dynamic Frequency Scaling", IEEE Journal of Solid State Circuits, vol. 41, No. 9, pp. 2077-2082, 2006.
Mair et al., "An architecture of high-performance frequency and phase synthesis," IEEE Journal of Solid State Circuits, vol. 35, No. 6, pp. 835-846, 2000.
Mesgarzadeh et al. "A Low-Power Digital DLL-Based Clock Generator in Opn-Loop Mode", IEEE Journal of Solid-State Circuits, vol. 44, No. 7, pp. 1907-1913, 2009.
Rapinoja et al., "A digital frequency synthesizer for cognitive radio spectrum sensing applications," IEEE Transactions on Microwave Theory and Techniques, vol. 58, No. 5, pp. 1339-1348, 2010.
Xiu et al. "Flying-adder fractional divider based integer-n PLL: 2nd generation Fapll as on-chip frequency generator for SoC," IEEE Journal of Solid-State Circuits, vol. 48, No. 2, pp. 441-455, 2013.
Yang et al. "A 2.5 GHz All-Digital Delay-Locked Loop in 0.13 um CMOS Technology". IEEE Journal of Solid-State Circuits, vol. 42, No. 11, pp. 2338-2347, 2007.

\* cited by examiner

ALL-DIGITAL DELAY-LOCKED LOOP TUNING METHOD WITH RANDOMIZED LSB-TUNING

FIELD

The subject matter described herein relates to signal generation including for example clock signal and/or local oscillator signal generation for system-on-chip (SoC) integrated circuits (IC).

BACKGROUND

System-on-chip (SoC) integrated circuit architectures may include various circuit blocks (also referred to as sub-blocks). These sub-blocks may include on the same die one or more of the following: a radio transceiver, an analog-to-digital/digital-to-analog converter, a digital signal processors, and/or the like. These sub-blocks may operate using one or more clock or local oscillator (LO) signals to enable for example signal up/down conversion and/or synchronization.

SUMMARY

In some example embodiments, there may be provided an apparatus. The apparatus may include a delay line including a plurality of cells; and tuning circuitry coupled to the delay line and configured to generate a first output and a second output to tune the delay of the delay line, wherein the first output tunes in aggregate the plurality of cells of the delay line, and wherein the second output tunes each of the plurality of cells separately.

In some variations, one or more of the features disclosed herein including the following features can optionally be included in any feasible combination. The second output may include at least one bit, wherein the at least one bit controls the tuning of at least one of the plurality of cells. The second output may include least significant bits, wherein each of the least significant bits controls a separate one of the plurality of cells. Each of the least significant bits may have a separate value. The second output may be scrambled. A phase detector may be coupled to the tuning circuitry and may provide a control signal input to the tuning circuitry, wherein the second output is generated based on the control signal input. At least one of a user equipment or a wireless access point may include the apparatus to enable generation of a signal, local oscillator, and/or clock.

The above-noted aspects and features may be implemented in systems, apparatus, methods, and/or articles depending on the desired configuration. The details of one or more variations of the subject matter described herein are set forth in the accompanying drawings and the description below. Features and advantages of the subject matter described herein will be apparent from the description and drawings, and from the claims.

Figure 1A:
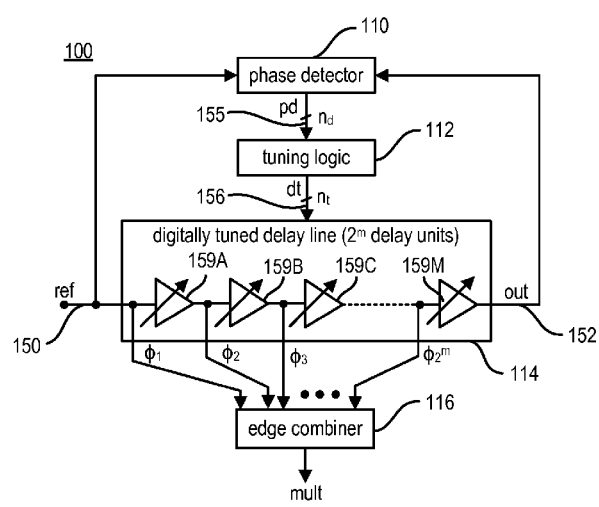
FIG. 1A-C depicts a system implementing a single control to tune all of the delay cells of a digitally tuned delay line.

Like labels are used to refer to same or similar items in the drawings.

DETAILED DESCRIPTION

In the case of circuits including SoC, there may be a need to generate simultaneously on the same chip a plurality of clock and/or local oscillator (LO) signals. When this is the case, a typical phase-locked loop (PLL)-based clock and LO signal generator may have an issue with for example oscillator interactions, such as frequency pulling. These oscillator interaction issues can make IC implementation of frequency synthesizers challenging in SoC architectures. To overcome oscillator coupling, open loop delay-locked loop (DLL) clock multipliers and multiplying DLL (MDLL) may be implemented.

To overcome the limited resolution of digitally controlled delay lines, some conventional DLL architectures may implement analog or mixed mode signaling, in which analog signaling is used for tuning purposes. However, analog signaling may increase the required die area and power dissipation of the implementation and may impair the portability of the DLL architecture to lower process node digital implementations including CMOS implementations. As such, some all-digital DLL architectures may minimize the tuning word "dithering" by disabling the digital control in the locked-state. Although this may reduce or remove the unwanted dithering behavior, the associated limited tuning resolution may cause a considerable phase mismatch between the delay line input and the delay line output signal.

FIG. 1A depicts a block diagram of an all-digital delay-locked loop 100 based frequency multiplier including a phase detector 110, a delay tuning logic 112, a digitally controlled delay line 114, and an edge combiner 116.

The phase detector 110 may compare the input 150 (labeled ref) and output 152 (labeled out) signals in order to generate a control word 155 (for example, an $n_d$-bit digital control, $p_d$) according to the phase difference of signals 150 and 152. Tuning logic 112 may receive control word 155 in order to generate another control word 156 (for example, $n_t$-bit digital control word ($d_t$)) to control the total delay of delay line 114, which includes a plurality of delay cells 159A-M. Although FIG. 1A depicts 4 delay cells, other quantity of delay cells may be used as well.

Figure 1B:
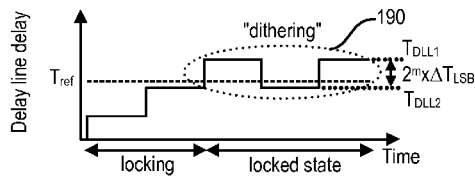

Each of the delay cells 159A-M are tuned with the same control word 156, so that the total delay of the delay line 114 is matched to a reference period. Due to the identical tuning of each delay cell 159A-M, delay line 114 tuning resolution may be limited to a certain value, such as $2^m \times \Delta T_{LSB}$, where $2^m$ is the number of delay units (or cells) in the delay line 114 and $\Delta T_{LSB}$ is the delay cell tuning resolution. $\Delta T_{LSB}$ may have a minimum value that can be implemented as an integrated circuit and, as such, the tuning resolution of the digitally controlled delay line cannot be reduced by only decreasing the delay cell tuning resolution ($\Delta T_{LSB}$). The limited delay line tuning resolution can cause a relatively large fluctuation ($2^m \times \Delta T_{LSB}$) in the delay line delay ($T_{DLL1}$ and $T_{DLL2}$) in the locked state, as shown at 190 at FIG. 1B.

Figure 1C:
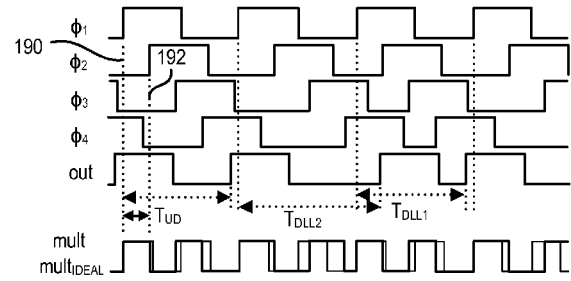

Frequency multiplication may be realized by selecting each of the generated reference phases ($\phi_1$-$\phi_2{}^m$) at a given time by edge combiner 116 (for example, selecting every other phase generated rising edge and every other falling edge of the frequency multiplied signal as shown at FIG. 1C at for example 192, 194, and so forth). Although FIG. 1C depicts a frequency multiplication operation by a factor of 2 for a 4-phase DLL, other quantities of frequency multiplication and/or phases may be used as well.

FIG. 1C depicts a delay fluctuation ($T_{DLL1}$-$T_{DLL2}$) in the delay line that causes fluctuation of the delay cell unit delay, $T_{UD}$, which forms the period of the frequency multiplied signal (labeled mult). Consequently, the DLL delay fluctuation may increase the period fluctuation (e.g., jitter) of the generated output signal 152, as depicted at FIG. 1C. This DLL delay fluctuation may increase the output signal jitter, so that in some instances it may be too large for high performance frequency synthesis applications.

In some example embodiments, the subject matter disclosed herein may provide, among other things, a tuning process for a digital DLL (for example, an all-digital DLL and the like) that utilizes separate delay cell tuning using for example one or more bits, such as least significant bit (LSB) tuning, to enable an increase in the tuning resolution of the digitally controlled delay line and/or to enable utilization of the digital DLL for high performance frequency synthesis applications.

In some example embodiments, a tuning process for an all-digital DLL may utilize separate delay cell LSB-tuning with randomization. In some example embodiments, the tuning method may increase the tuning resolution of the digitally controlled delay line to match the tuning resolution of a single delay cell. In a DLL-based frequency synthesizer, the jitter contribution of the all-digital DLL may decrease, which may enable the utilization of all-digital DLL for high performance frequency synthesis applications.

In some example embodiments, each of the delay line delay cells may, as noted, be tuned separately, so that the total delay of the delay line can be tuned with resolution that is equal to the resolution of single delay unit $\Delta T_{LSB}$. This may, in some example embodiments, reduce the magnitude of the delay fluctuation (dithering) and input/output delay error in the digitally controlled delay line.

Figure 2:
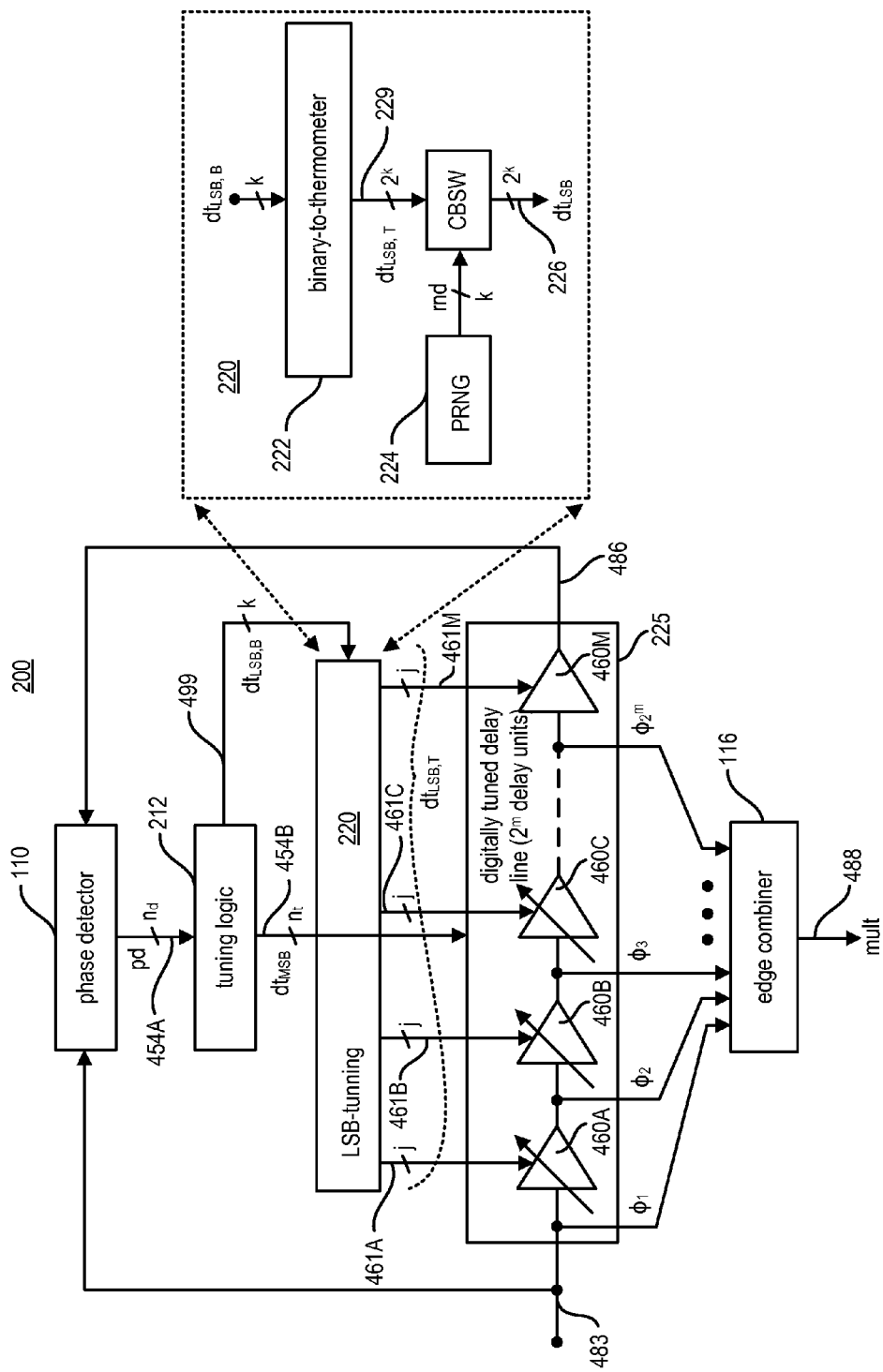
FIG. 2 depicts a system implementing separate, individual control to tune each of the delay cells individually, in accordance with some example embodiments.

FIG. 2 depicts an example block diagram of an all-digital delay-locked loop tuning system 200, in accordance with some example embodiments. The delay-locked loop 200 may include a phase detector 110, tuning logic 212, an LSB tuner 220, a digitally tuned/controlled delay line 225, and an edge combiner 116.

Phase detector 110 may compare the input reference signal 483 (labeled ref) and output signal 486 (labeled out) in order to generate a control word $n_d$ 454A according to the phase difference of signals 483 and 486.

Tuning logic 212 may receive control word 454A in order to generate control word 454B. Tuning logic may also provide one or more additional bits 499, which are output to LSB tuner 220. Tuning logic 212 may provide $n_{t+m}$ bits for delay tuning. Specifically, the $n_t$ most significant bits ($dt_{MSB}$) 454B may tune in aggregate all of the delay cells, while the m least significant bits ($dt_{LSB}$) 499 may tune via 461A-M each of the delay cells 460A-M separately. In the example of FIG. 2, each of the delay cells 460A-M has a k-bit separate LSB tuning control for each of the delay cells 461A-M.

Control word 499 may thus provide separate tuning for each of the delay cells 460A-M, in accordance with some example embodiments. This additional separate set of j-bit LSB tuning control bits may control the tuning of the corresponding cell delay with a resolution of for example $\Delta T_{LSB}$. The LSB-tuning control may, in some example embodiments, be generated from the tuning word least significant bits by utilizing a binary-to-thermometer decoder 222, although other types of decoders may be used as well. Decoder 222 may generate a set of controls 229 ($dt_{LSB,T}$), whose value corresponds to the binary input of controls 499 ($dt_{LSB,B}$), so that the sum of digital "1"s in the controls 229 ($dt_{LSB,T}$) corresponds to the decimal value of the binary input of controls 499 ($dt_{LSB,B}$).

To minimize the additional hardware circuitry and routing required to implement the separate delay cell tuning control, system 100 may, in some example embodiments, utilize only 1-bit separate LSB control for each of the delay cells 460A-M in the delay line 225, although other quantities of control lines and delay cells may be used as well. In the case of 1-bit separate LSB control, this may increase the delay line tuning resolution by a factor of 2m to $\Delta T_{LSB}$, as depicted at FIG. 3, with a minimum of additional circuitry/hardware.

Figure 3:
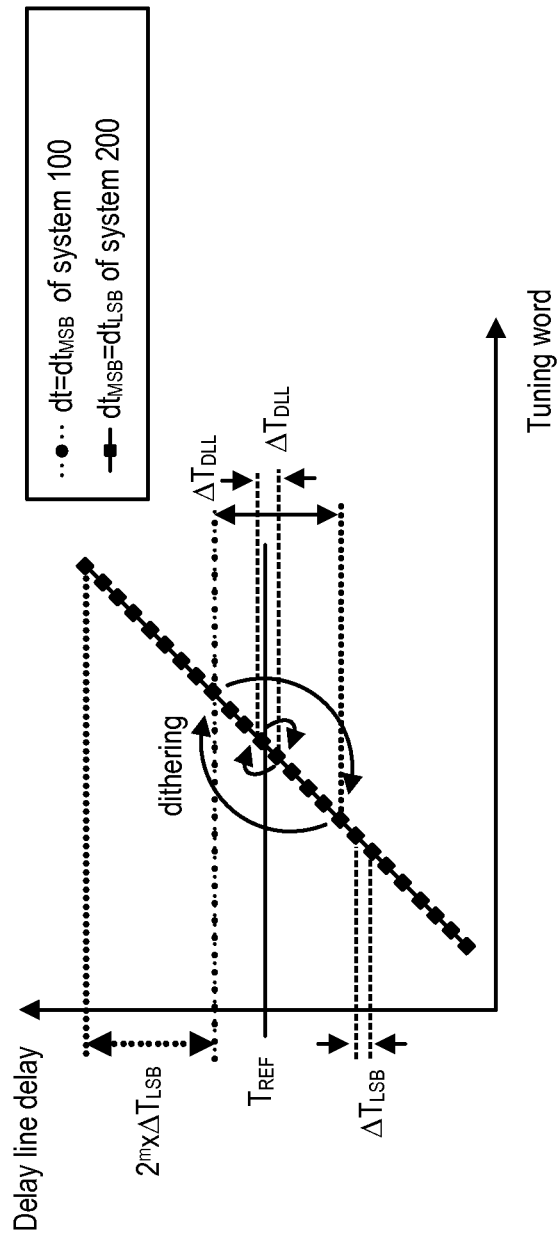
FIG. 3 depicts plots comparing the delay transfer function of the systems of FIGS. 1 and 2, in accordance with some example embodiments.

FIG. 3 provides a plot of the digital delay control-to-delay transfer functions to show the delay dithering behavior in the digital delay-locked loop. In the system 100 (FIG. 1) using aggregate control of the digitally tuned delay line, the delay of the delay line fluctuates between two values whose delay difference is $2^m \times \Delta T_{LSB}$, where $2^m$ is the number of delay cells in the delay line and $\Delta T_{LSB}$ is the delay cell tuning resolution. In contrast, given system 200 (FIG. 2) in which delay line tuning is done separately using one or more least significant bits to each of the delay cells, the tuning resolution of the delay line to $\Delta T_{LSB}$ may be increased. Consequently, the magnitude of the delay fluctuation may be decreased considerably, for example by a factor of 8 as depicted in FIG. 3.

Figure 4:
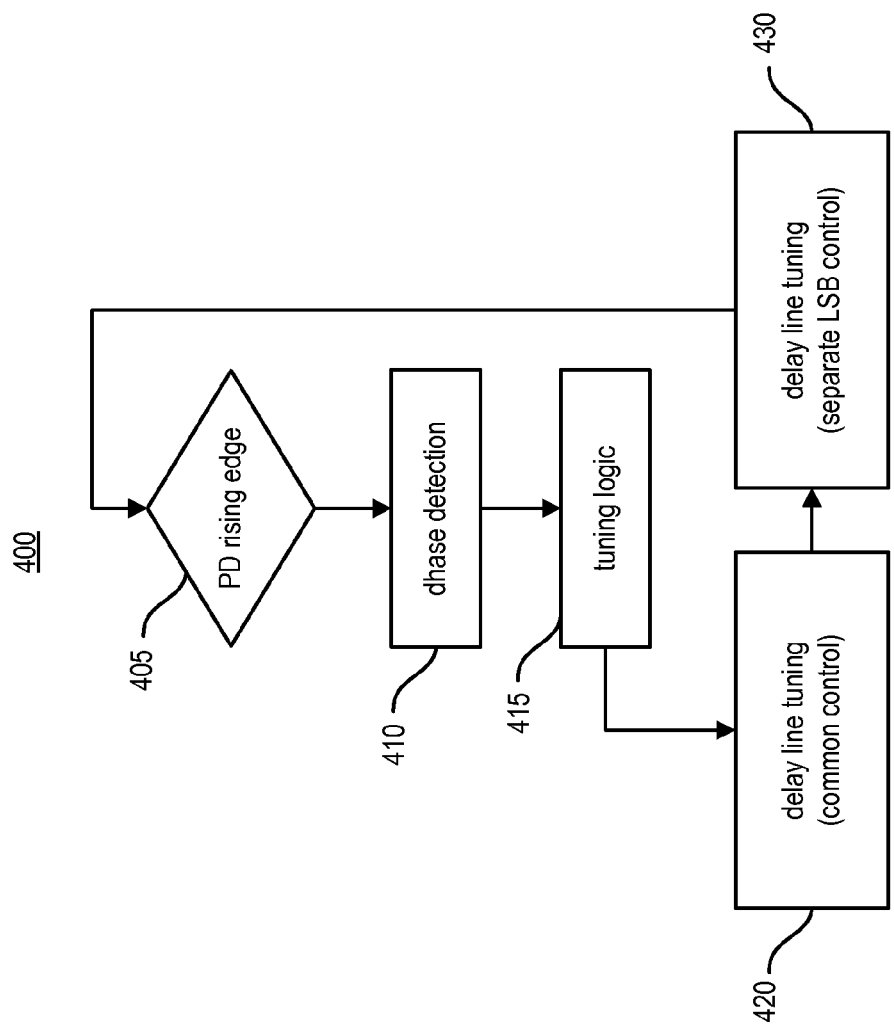
FIG. 4 depicts a process for separate control of the tuning of each of the delay cells, in accordance with some example embodiments.

FIG. 4 depicts an example process for LSB-tuning, in accordance with some example embodiments. The description of FIG. 4 also refers to FIG. 1.

In some example embodiments, phase detector 110 may, at 405, trigger on an edge, such as a rising edge, and then compare, at 410, input reference signal 483 and output signal 486 to generate control word $n_d$ 454A according to the phase difference of signals 483 and 486. At 415, tuning logic 212 may receive control word 454A and generate $n_{t+m}$ bits 454B and 499 for delay tuning, in accordance with some example embodiments. At 420, the $n_t$ most significant bits ($dt_{MSB}$) 454B may tune in aggregate all of the delay cells 460A-M, in accordance with some example embodiments. At 430, the m least significant bits ($dt_{LSB}$) 499 may tune via 461A-M each of the delay cells 460A-M separately.

Figure 5:
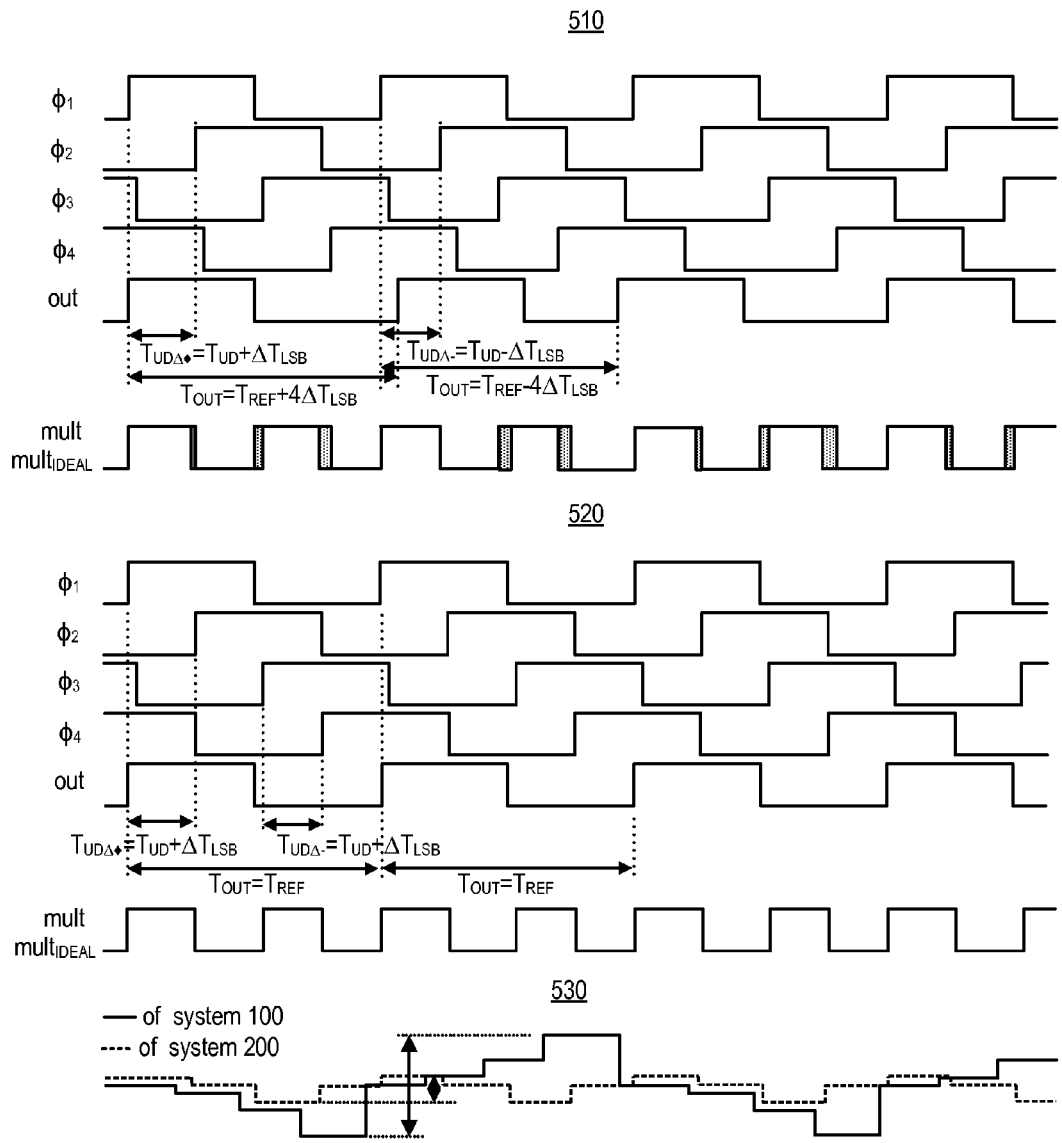
FIG. 5 depicts a plot 510 of the period fluctuation of the multiplied output signal for system 100 and a plot 520 of the period fluctuation of the multiplied output signal for system 200, a plot 530 of the comparison of the resulting instantaneous phase error in the multiplied output signals for systems 100 and 200, in accordance with some example embodiments.

FIG. 5 depicts a plot 510 of the period fluctuation of the multiplied output signal for system 100 and a plot 520 of the period fluctuation of the multiplied output signal for system 200, in accordance with some example embodiments. Although FIG. 5 depicts only a 4-phase DLL, other quantities of DLL may be used as well. In the case of higher number of DLL phases, the relative difference in jitter between system 100 and a DLL having individual control as in system 200 may increase. Plot 530 depicts the magnitude of the instantaneous phase error between the reference signal and output signals for system 100 and system 200. The plot 530 highlights the phase error magnitude reductions that may result from the utilization of system 200.

FIGS. 3 and 5 show that that the individual LSB-tuning depicted at FIG. 2 may increase the total delay line resolution, but may create some deterministic jitter in a DLL-based frequency multiplier due to the different delay unit cell delays ($T_{UDA+}$ and $T_{UDA-}$). In addition to the deterministic jitter, the delay fluctuation may be periodic which may create spurious tones to the output spectrum of the frequency multiplied signal (mult). In order to suppress these tones, the system 200 may include an additional $2^m$-to-$2^m$ crossbar switch 226 (labeled CBSW) that is controlled by a pseudorandom number generator 224 (labeled PRNG). The crossbar switch 226 and pseudorandom number generator 224 structure may randomize the location of "1" s in the thermometer coded LSB-tuning control $dt_{LSB,T}$ and thus suppress the spurious tones from the output spectrum.

Figure 6:
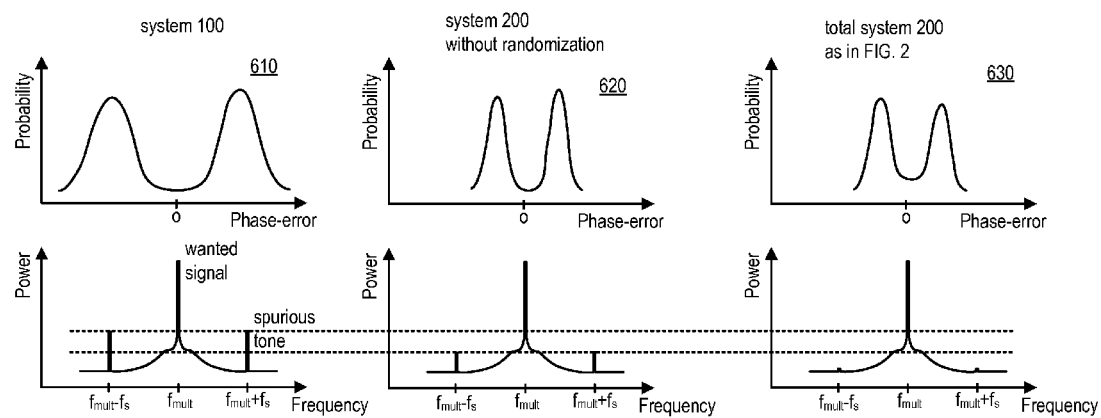
FIG. 6 depicts plots for the system 100 of FIG. 1 and the system 200 of FIG. 2 with and without randomization, in accordance with some example embodiments.

FIG. 6 illustrates the phase error distribution and the spectrum of the frequency multiplied signal for the system 100. In the case of system 100, the magnitude of the phase error fluctuation (610) may be relatively large which can result in large spurious tones in the spectrum of the frequency multiplied signal (mult). As the system 200 is introduced with separate LSB tuning of the delay cells (PRNG 224 and CBSW (229) excluded at 620), the magnitude of the phase-error fluctuation (620) may be decreased (as shown also in plot 530) and the level of the spurious tones may be decreased. Introducing random patterning (or scrambling) of the ones in the thermometer coded LSB-tuning word 499 (using the PRNG (224) and CSBW (226)), the periodic nature of the phase-error may be modified to a more random tuning sequence (630). Although, the randomization will not decrease magnitude of the phase error fluctuation, the more random nature of it will further reduce level of the spurious tones.

Figure 7:
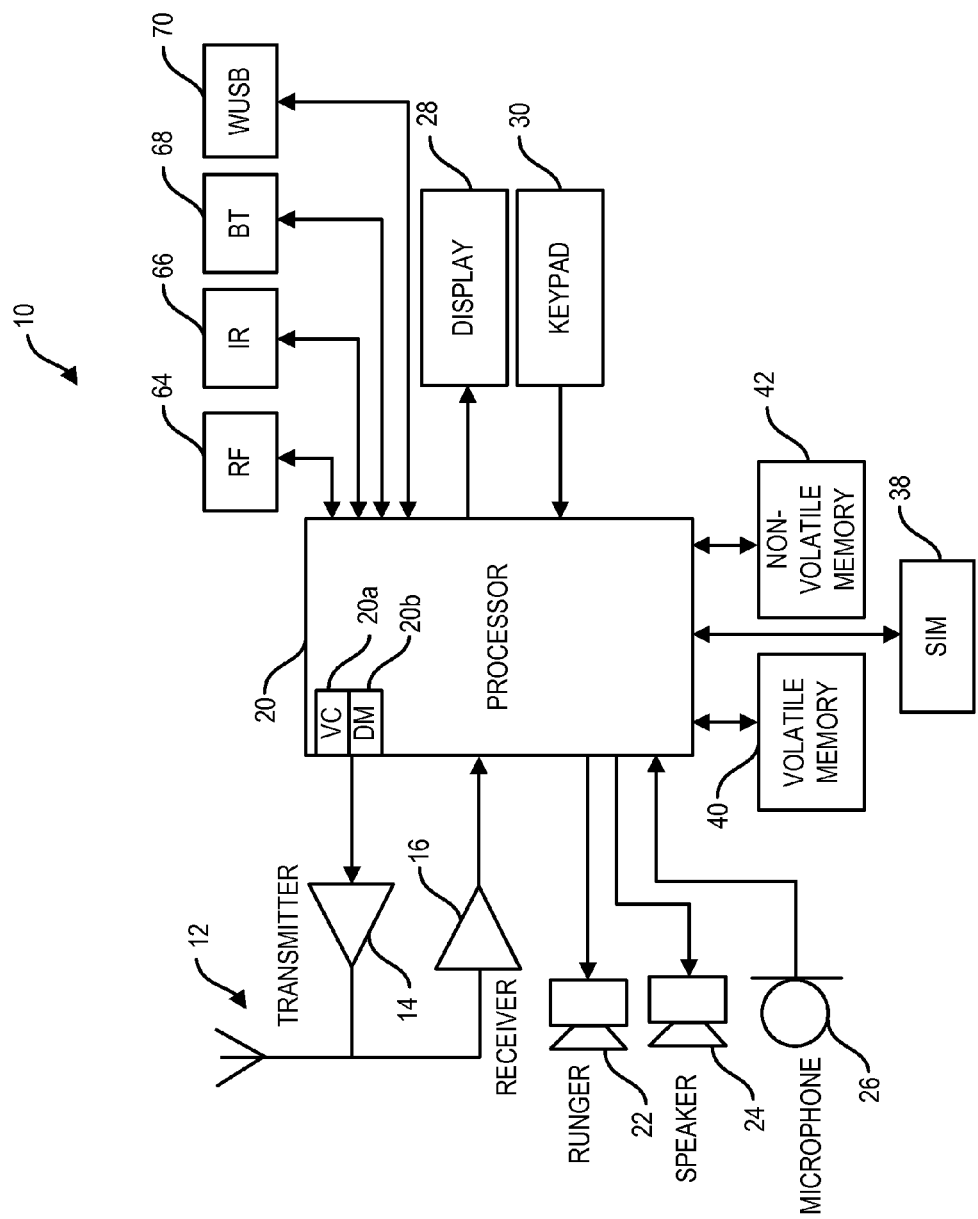
FIG. 7 depicts an example of a radio, in accordance with some example embodiments.

FIG. 7 illustrates a block diagram of an apparatus 10, in accordance with some example embodiments. Apparatus 10 may include a radio frequency section including a transmitter 14 and/or a receiver 16. Moreover, the radio frequency section may generate a signal, such as a clock or local oscillator using the separate controlled delay cell tuning (for example, as depicted in FIG. 2), although the separate controlled delay cell tuning may be used in other portions of apparatus 10 as well. Moreover, apparatus 10 may be implemented as a user equipment, such as a smart phone as well as any other type of radio including an access point and/or base station.

The apparatus 10 may, in some example embodiments, include at least one antenna 12 in communication with a transmitter 14 and a receiver 16. Alternatively transmit and receive antennas may be separate.

The apparatus 10 may, in some example embodiments, also include a processor 20 configured to provide signals to and receive signals from the transmitter and receiver, respectively, and to control the functioning of the apparatus. Processor 20 may be configured to control the functioning of the transmitter and receiver by effecting control signaling via electrical leads to the transmitter and receiver. Likewise, processor 20 may be configured to control other elements of apparatus 10 by effecting control signaling via electrical leads connecting processor 20 to the other elements, such as a display or a memory. The processor 20 may, for example, be embodied in a variety of ways including circuitry, at least one processing core, one or more microprocessors with accompanying digital signal processor(s), one or more processor(s) without an accompanying digital signal processor, one or more coprocessors, one or more multi-core processors, one or more controllers, processing circuitry, one or more computers, various other processing elements including integrated circuits (for example, an application specific integrated circuit (ASIC), a field programmable gate array (FPGA), and/or the like), or some combination thereof. Accordingly, although illustrated in FIG. 7 as a single processor, in some example embodiments the processor 20 may comprise a plurality of processors or processing cores.

Signals sent and received by the processor 20 may include signaling information in accordance with an air interface standard of an applicable cellular system, and/or any number of different wireline or wireless networking techniques, comprising but not limited to Wi-Fi, wireless local access network (WLAN) techniques, such as Institute of Electrical and Electronics Engineers (IEEE) 802.11, 802.16, and/or the like. In addition, these signals may include speech data, user generated data, user requested data, and/or the like.

The apparatus 10 may be capable of operating with one or more air interface standards, communication protocols, modulation types, access types, and/or the like. For example, the apparatus 10 and/or a cellular modem therein may be capable of operating in accordance with various first generation (1G) communication protocols, second generation (2G or 2.5G) communication protocols, third-generation (3G) communication protocols, fourth-generation (4G) communication protocols, Internet Protocol Multimedia Subsystem (IMS) communication protocols (for example, session initiation protocol (SIP) and/or the like. For example, the apparatus 10 may be capable of operating in accordance with 2G wireless communication protocols IS-136, Time Division Multiple Access TDMA, Global System for Mobile communications, GSM, IS-95, Code Division Multiple Access, CDMA, and/or the like. In addition, for example, the apparatus 10 may be capable of operating in accordance with 2.5G wireless communication protocols General Packet Radio Service (GPRS), Enhanced Data GSM Environment (EDGE), and/or the like. Further, for example, the apparatus 10 may be capable of operating in accordance with 3G wireless communication protocols, such as Universal Mobile Telecommunications System (UMTS), Code Division Multiple Access 2000 (CDMA2000), Wideband Code Division Multiple Access (WCDMA), Time Division-Synchronous Code Division Multiple Access (TD-SCDMA), and/or the like. The apparatus 10 may be additionally capable of operating in accordance with 3.9G wireless communication protocols, such as Long Term Evolution (LTE), Evolved Universal Terrestrial Radio Access Network (E-UTRAN), and/or the like. Additionally, for example, the apparatus 10 may be capable of operating in accordance with 4G wireless communication protocols, such as LTE Advanced and/or the like as well as similar wireless communication protocols that may be subsequently developed.

It is understood that the processor 20 may include circuitry for implementing audio/video and logic functions of apparatus 10. For example, the processor 20 may comprise a digital signal processor device, a microprocessor device, an analog-to-digital converter, a digital-to-analog converter, and/or the like. Control and signal processing functions of the apparatus 10 may be allocated between these devices according to their respective capabilities. The processor 20 may additionally comprise an internal voice coder (VC) 20a, an internal data modem (DM) 20b, and/or the like. Further, the processor 20 may include functionality to operate one or more software programs, which may be stored in memory.

In general, processor 20 and stored software instructions may be configured to cause apparatus 10 to perform actions. For example, processor 20 may be capable of operating a connectivity program, such as a web browser. The connectivity program may allow the apparatus 10 to transmit and receive web content, such as location-based content, according to a protocol, such as wireless application protocol, WAP, hypertext transfer protocol, HTTP, and/or the like.

Apparatus 10 may also comprise a user interface including, for example, an earphone or speaker 24, a ringer 22, a microphone 26, a display 28, a user input interface, and/or the like, which may be operationally coupled to the processor 20. The display 28 may, as noted above, include a touch sensitive display, where a user may touch and/or gesture to make selections, enter values, and/or the like. The processor 20 may also include user interface circuitry configured to control at least some functions of one or more elements of the user interface, such as the speaker 24, the ringer 22, the microphone 26, the display 28, and/or the like. The processor 20 and/or user interface circuitry comprising the processor 20 may be configured to control one or more functions of one or more elements of the user interface through computer program instructions, for example, software and/or firmware, stored on a memory accessible to the processor 20, for example, volatile memory 40, non-volatile memory 42, and/or the like. The apparatus 10 may include a battery for powering various circuits related to the mobile terminal, for example, a circuit to provide mechanical vibration as a detectable output. The user input interface may comprise devices allowing the apparatus 20 to receive data, such as a keypad 30 (which can be a virtual keyboard presented on display 28 or an externally coupled keyboard) and/or other input devices.

As shown in FIG. 7, apparatus 10 may also include one or more mechanisms for sharing and/or obtaining data. For example, the apparatus 10 may include a short-range radio frequency (RF) transceiver and/or interrogator 64, so data may be shared with and/or obtained from electronic devices in accordance with RF techniques. The apparatus 10 may include other short-range transceivers, such as an infrared (IR) transceiver 66, a Bluetooth™ (BT) transceiver 68 operating using Bluetooth™ wireless technology, a wireless universal serial bus (USB) transceiver 70, a Bluetooth™ Low Energy transceiver, a ZigBee transceiver, an ANT transceiver, a cellular device-to-device transceiver, a wireless local area link transceiver, and/or any other short-range radio technology. Apparatus 10 and, in particular, the short-range transceiver may be capable of transmitting data to and/or receiving data from electronic devices within the proximity of the apparatus, such as within 10 meters, for example. The apparatus 10 including the Wi-Fi or wireless local area networking modem may also be capable of transmitting and/or receiving data from electronic devices according to various wireless networking techniques, including 6LoWpan, Wi-Fi, Wi-Fi low power, WLAN techniques such as IEEE 802.11 techniques, IEEE 802.15 techniques, IEEE 802.16 techniques, and/or the like.

The apparatus 10 may comprise memory, such as a subscriber identity module (SIM) 38, a removable user identity module (R-UIM), a eUICC, an UICC, and/or the like, which may store information elements related to a mobile subscriber. In addition to the SIM, the apparatus 10 may include other removable and/or fixed memory. The apparatus 10 may include volatile memory 40 and/or non-volatile memory 42. For example, volatile memory 40 may include Random Access Memory (RAM) including dynamic and/or static RAM, on-chip or off-chip cache memory, and/or the like. Non-volatile memory 42, which may be embedded and/or removable, may include, for example, read-only memory, flash memory, magnetic storage devices, for example, hard disks, floppy disk drives, magnetic tape, optical disc drives and/or media, non-volatile random access memory (NVRAM), and/or the like. Like volatile memory 40, non-volatile memory 42 may include a cache area for temporary storage of data. At least part of the volatile and/or non-volatile memory may be embedded in processor 20. The memories may store one or more software programs, instructions, pieces of information, data, and/or the like which may be used by the apparatus to perform one or more of the operations disclosed herein with respect to separately controlled delay cell tuning (for example, as depicted in FIGS. 2 and 4) disclosed herein. The memories may comprise an identifier, such as an international mobile equipment identification (IMEI) code, capable of uniquely identifying apparatus 10. The functions may include one or more of the operations disclosed with respect the all-digital delay-locked loop with randomized LSB-tuning method disclosed herein including, for example, generating, at tuning circuitry, a first output, generating, at the tuning circuitry, a second output, wherein the tuning circuitry is coupled to a delay line including a plurality of cells, and/or tuning, by the tuning circuitry, a delay of the delay line, the tuning performed based on the first output and the second output, wherein the first output tunes in aggregate the plurality of cells of the delay line, and wherein the second output tunes each of the plurality of cells separately. The memories may comprise an identifier, such as an international mobile equipment identification (IMEI) code, capable of uniquely identifying apparatus 10. In the example embodiment, the processor 20 may be configured using computer code stored at memory 40 and/or 42 to perform one or more of the operations disclosed herein with respect to separately controlled delay cell tuning (for example, as depicted in FIGS. 2 and 4) disclosed herein.

Some of the embodiments disclosed herein may be implemented in software, hardware, application logic, or a combination of software, hardware, and application logic. The software, application logic, and/or hardware may reside on memory 40, the control apparatus 20, or electronic components, for example. In some example embodiment, the application logic, software or an instruction set is maintained on any one of various conventional computer-readable media. In the context of this document, a "computer-readable medium" may be any non-transitory media that can contain, store, communicate, propagate or transport the instructions for use by or in connection with an instruction execution system, apparatus, or device, such as a computer or data processor circuitry, with examples depicted at FIG. 7, computer-readable medium may comprise a non-transitory computer-readable storage medium that may be any media that can contain or store the instructions for use by or in connection with an instruction execution system, apparatus, or device, such as a computer.

Without in any way limiting the scope, interpretation, or application of the claims appearing below, a technical effect of one or more of the example embodiments disclosed herein is an increase in the tuning resolution of the digitally controlled delay line to match the tuning resolution of a single delay cell.

Although some of the examples and drawings herein depict specific values, these are merely examples as other values may be realized as well.

If desired, the different functions discussed herein may be performed in a different order and/or concurrently with each other. Furthermore, if desired, one or more of the above-described functions may be optional or may be combined. Although various aspects of some of the embodiments are set out in the independent claims, other aspects of some of the embodiments may comprise other combinations of features from the described embodiments and/or the dependent claims with the features of the independent claims, and not solely the combinations explicitly set out in the claims. It is also noted herein that while the above describes example embodiments, these descriptions should not be viewed in a limiting sense. Rather, there are several variations and modifications that may be made without departing from the scope of the some of the embodiments as defined in the appended claims. Other embodiments may be within the scope of the following claims. The term "based on" includes "based on at least." The use of the phase "such as" means "such as for example" unless otherwise indicated.

What is claimed:

1. An apparatus comprising:
a digital delay line including a plurality of cells; and
a digital tuning circuitry, coupled to the digital delay line, configured to generate a first output and a second randomized output to digitally tune the delay of the digital delay line, wherein the first output digitally tunes in aggregate the plurality of cells of the digital delay line, and wherein the second randomized output digitally tunes an individual delay of each of the plurality of cells, of the digital delay line, separately.

2. The apparatus of claim 1, wherein the second randomized output comprises at least one bit, wherein the at least one bit controls the tuning of at least one of the plurality of cells.

3. The apparatus of claim 1, wherein the second randomized output comprises least significant bits, wherein each of the least significant bits controls a separate one of the plurality of cells.

4. The apparatus of claim 1, wherein the second randomized output comprises least significant bits, wherein each of the least significant bits controls a separate one of the plurality of cells, wherein each of the least significant bits has a separate value.

5. The apparatus of claim 1, wherein the second randomized output is scrambled.

6. The apparatus of claim 1 further comprising:
a phase detector, coupled to the tuning circuitry, to provide a control signal input to the tuning circuitry, wherein the second randomized output is generated based on the control signal input.

7. The apparatus of claim 1, wherein at least one of a user equipment or a wireless access point includes the apparatus to enable generation of a signal, a local oscillator, and/or a clock.

8. A method comprising:
generating, at tuning circuitry, a first output;
generating, at the tuning circuitry, a second randomized output, wherein the tuning circuitry is coupled to a digital delay line including a plurality of cells;
a digital tuning, by the tuning circuitry, a delay of the digital delay line, the digital tuning performed based on the first output and the second randomized output, wherein the first output tunes in aggregate the plurality of cells of the digital delay line, and wherein the second randomized output tunes an individual delay of each of the plurality of cells, of the digital delay line, separately.

9. The method of claim 8, wherein the second randomized output comprises at least one bit, wherein the at least one bit controls the tuning of at least one of the plurality of cells.

10. The method of claim 8, wherein the second randomized output comprises least significant bits, wherein each of the least significant bits controls a separate one of the plurality of cells.

11. The method of claim 8, wherein the second randomized output comprises least significant bits, wherein each of the least significant bits controls a separate one of the plurality of cells, wherein each of the least significant bits has a separate value.

12. The method of claim 8, wherein the second randomized output is scrambled.

13. The method of claim 8 further comprising:
providing, by a phase detector coupled to the tuning circuitry, a control signal input to the tuning circuitry, wherein the second randomized output is generated based on the control signal input.

14. The method of claim 8, wherein at least one of a user equipment or a wireless access point includes the tuning circuitry and the digital delay line to enable generation of a signal, a local oscillator, and/or a clock.

15. A non-transitory computer-readable storage medium including computer program code which when executed by at least one processor causes operations comprising:
generating, at tuning circuitry, a first output;
generating, at the tuning circuitry, a second randomized output, wherein the tuning circuitry is coupled to a delay line including a plurality of cells;
a digital tuning, by the tuning circuitry, a delay of the delay line, the digital tuning performed based on the first output and the second randomized output, wherein the first output digitally tunes in aggregate the plurality of cells of the delay line, and wherein the second randomized output digitally tunes each of the plurality of cells separately.

16. An apparatus comprising:
means for generating, at the apparatus, a first output;
means for generating, at the apparatus, a second randomized output, wherein the apparatus is coupled to a delay line including a plurality of cells;
means for digitally tuning, by the apparatus, a delay of the digital delay line, the digital tuning performed based on the first output and the second randomized output, wherein the first output digitally tunes in aggregate the plurality of cells of the digital delay line, and wherein the second randomized output digitally tunes an individual delay of each of the plurality of cells, of the digital delay line, separately.

17. The apparatus of claim 16, wherein the second randomized output comprises at least one bit, wherein the at least one bit controls the tuning of at least one of the plurality of cells.

18. The apparatus of claim 16, wherein the second randomized output comprises least significant bits, wherein each of the least significant bits controls a separate one of the plurality of cells.

19. The apparatus of claim 16, wherein the second randomized output comprises least significant bits, wherein each of the least significant bits controls a separate one of the plurality of cells, wherein each of the least significant bits has a separate value.

20. The apparatus of claim 16, wherein the second randomized output is scrambled.

21. The apparatus of claim 16 further comprising:
means for providing, by a phase detector coupled to the apparatus, a control signal input to the tuning circuitry, wherein the second randomized output is generated based on the control signal input.

22. The apparatus of claim 16, wherein at least one of a user equipment or a wireless access point includes the apparatus to enable generation of a signal, a local oscillator, and/or a clock.

23. The apparatus of claim 1, wherein the digital tuning circuitry includes a pseudorandom number generator configured to introduce random patterning to the second digital output.

24. The apparatus of claim 1, wherein the tuning of the digital delay line is limited to digital tuning.

* * * * *